United States Patent
Lim et al.

(10) Patent No.: US 8,650,463 B2
(45) Date of Patent: Feb. 11, 2014

(54) SOLID STATE DRIVE AND METHOD OF CONTROLLING AN ERROR THEREOF

(75) Inventors: Seungho Lim, Suwon-si (KR); Jung-Yeon Yoon, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 266 days.

(21) Appl. No.: 13/013,079

(22) Filed: Jan. 25, 2011

(65) Prior Publication Data

US 2011/0191649 A1 Aug. 4, 2011

(30) Foreign Application Priority Data

Feb. 1, 2010 (KR) ........................ 10-2010-0009250

(51) Int. Cl.
*G11C 29/00* (2006.01)

(52) U.S. Cl.
USPC .......................................... 714/773; 714/766

(58) Field of Classification Search
USPC .................................................. 714/773, 766
See application file for complete search history.

(56) References Cited

U.S. PATENT DOCUMENTS

| | | | |
|---|---|---|---|
| 4,799,221 A * | 1/1989 | Fukami et al. | 714/764 |
| 6,839,782 B1 * | 1/2005 | Scaringella et al. | 710/104 |
| 7,536,627 B2 | 5/2009 | Gross et al. | |
| 2007/0094447 A1 * | 4/2007 | Matsunami et al. | 711/114 |
| 2008/0235557 A1 * | 9/2008 | Kim | 714/755 |
| 2009/0249167 A1 * | 10/2009 | Nakaigawa | 714/763 |

FOREIGN PATENT DOCUMENTS

| | | |
|---|---|---|
| JP | 2006-018373 | 1/2006 |
| KR | 20080022630 | 3/2008 |

* cited by examiner

*Primary Examiner* — Guy Lamarre
(74) *Attorney, Agent, or Firm* — Stanzione & Kim, LLP

(57) ABSTRACT

The present general inventive concept relates to a solid state drive and a method of controlling an error thereof. A flash translation layer includes a parity managing module to correct errors. A block address of a storage medium including error data that can be recovered is managed through the parity managing module. Parity data of a block including error data is generated through the parity managing module. The generated parity data is managed through the parity managing module. The generated parity data can be stored in an assigned area of the storage medium. When data of a block managed by the parity managing module is not recovered by an error correction code unit, error data is recovered with reference to the generated parity data.

20 Claims, 10 Drawing Sheets

SOLID STATE DRIVE AND METHOD OF CONTROLLING AN ERROR THEREOF

CROSS-REFERENCE TO RELATED APPLICATIONS

This U.S. non-provisional patent application claims priority under 35 U.S.C. §119(a) from Korean Patent Application No. 10-2010-0009250, filed on Feb. 1, 2010, the entire contents of which are hereby incorporated by reference.

BACKGROUND

1. Field of the Invention

The present general inventive concept herein relates to a data storage device, and more particularly, to a solid state drive which can correct data errors and a method of controlling data errors thereof.

2. Description of the Related Art

Recently, a paradigm of a computer environment is being converted into a ubiquitous computing environment in which a computer system can be used anytime and anywhere. Thus, a use of a portable electronic device such as a cellular phone, a PMP (portable media player), a digital camera or a notebook computer highly increases. A portable electronic device uses a data storage device using a memory device instead of a hard disk drive.

A solid state drive (SSD) is a data storage device using a memory device. The SSD is a data storage device is a storage medium that is a memory device. The SSD may be used like a hard disk drive using a host interface such as PATA (Parallel Advanced Technology Attachment) or SATA (Serial Advanced Technology Attachment) used in an existing data storage device. The SSD has advantages of having no mechanical driving portion, stability, durability, high speed of accessing information and low power consumption.

The SSD can be divided according to a type of storage media. For example, the SSD can be divided into a SSD using a volatile memory device as a storage medium and a SSD using a nonvolatile memory device as a storage medium. The SSD using a volatile memory device as a storage medium uses a high speed volatile memory device (for example, SDRAM (Synchronous Dynamic Random Access Memory)) as a storage medium. The SSD using a volatile memory device as a storage medium has a high speed data access speed. Thus, the SSD using a volatile memory device as a storage medium is mainly used to increase an application speed. The SSD using a volatile memory device as a storage medium may include an internal battery and a back up disk system to maintain data for a predetermined time.

The SSD using a nonvolatile memory device as a storage medium uses a higher-capacity nonvolatile memory device (for example, a flash memory device) as a storage medium. The SSD using a nonvolatile memory device as a storage medium can easily increase a storage capacity. Thus, the SSD using a nonvolatile memory device is used as a storage medium instead of a hard disk drive (HDD).

SUMMARY

Exemplary embodiments of the present general inventive concept provide a solid state drive and methods of controlling the solid state drive to correct and/or control data errors.

Additional features and utilities of the present general inventive concept will be set forth in part in the description which follows and, in part, will be obvious from the description, or may be learned by practice of the present general inventive concept.

Embodiments of the present general inventive concept provide a method of controlling an error of a solid state drive. The method may include detecting and correcting an error of data read from a nonvolatile memory device, registering an address of an area in which the detected error data is stored in a parity group, generating parity data from data of the area registered in the parity group, and storing the address included in the parity group and the parity data in a parity area.

Embodiments of the present general inventive concept also provide a solid state drive. The solid state drive may include a nonvolatile memory device, and a controller having an interface between the nonvolatile memory device and a host and including an error correction code unit to detect and correct an error. When an error which can be corrected by the error correction code unit is detected in data read from the nonvolatile memory device, the controller stores data of an area in which the read data is stored as parity data. When an error which is not corrected by the error correction code unit is detected in data read from the nonvolatile memory device, the controller corrects the uncorrectable error with reference to the stored parity data.

Exemplary embodiments of the present general inventive concept may also provide a method of controlling parity management in a solid state drive, including determining whether an address at which error data occurs is included in a parity group, when the address is included in the parity group, recovering data with parity data stored in a parity block of the parity group, and when the address is not included in the parity group, outputting an error message from the solid state drive of the presence of the error data.

The recovering data of the method may include performing an exclusive OR on the parity data stored in the parity block and data in the blocks included in parity group.

The method may include determining whether the error data is recoverable, and when the error data is recoverable, correcting the error data and generating new parity data, and when the error data is not recoverable, performing the determining whether an address at which the error data occurs is included in the parity group.

The generating the parity data may include inserting an address of the recoverable error data into the parity group, and storing the generated new parity data in the parity block.

The method may include outputting the error corrected data from the solid state drive.

Exemplary embodiments of the present general inventive concept may also provide a solid state drive, including a nonvolatile memory device, a controller having an interface between the nonvolatile memory device and a host and including an error correction code unit to detect and correct an error, where the controller determines whether an address at which error data occurs is included in a parity group, and when the address is included in the parity group, recovering data with parity data stored in a parity block of the parity group, and when the address is not included in the parity group, the controller outputs an error message of the presence of the error data.

The controller of the solid state drive can recover data by performing an exclusive OR on the parity data stored in the parity block and data in the blocks included in parity group.

The controller of the solid state drive can determines whether the error data is recoverable, and when the error data is recoverable, the controller corrects the error data and generates new parity data, and when the error data is not recoverable, the controller determines whether an address at which the error data occurs is included in the parity group.

The controller of the solid state drive can generate the parity data by inserting an address of the recoverable error data into the parity group, and stores the generated new parity data in the parity block.

The controller of the solid state drive can output the error corrected data to the host.

BRIEF DESCRIPTION OF THE DRAWINGS

The above and/or other features and utilities of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
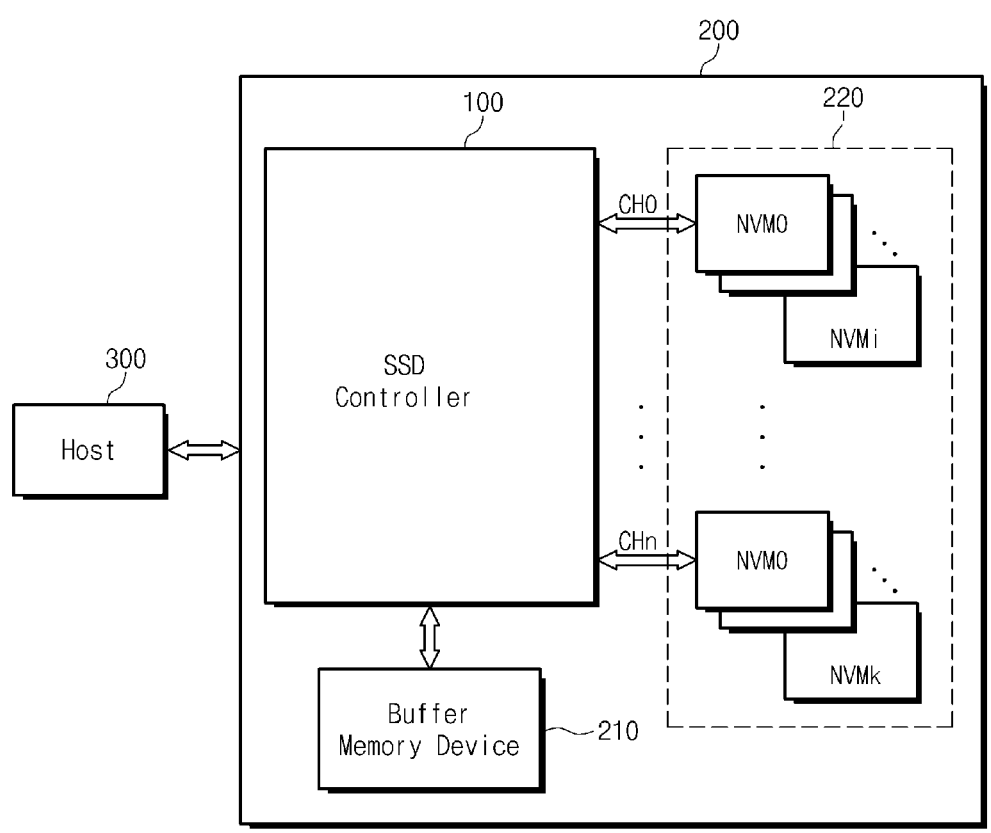
FIG. 1 is a block diagram illustrating a solid state drive in accordance with exemplary embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In the drawings, the thickness of layers and regions are exaggerated for clarity. The terminology used herein is for the purpose of describing particular embodiments only and is not intended to be limiting of the invention. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a block diagram illustrating a solid state drive (SSD) in accordance with exemplary embodiments of the present general inventive concept.

Referring to FIG. 1, a SSD 200 can include a SSD controller 100, a buffer memory device 210, and a storage medium 220. The SSD 200 in accordance with exemplary embodiments of the present general inventive concept may include a temporary power supply circuit including super capacitors, electric double-layer capacitors, electrochemical double layer capacitors, and/or ultracapacitors. When a sudden power off occurs, the temporary power supply circuit can supply a power supply so that the SSD 200 can operate normally, and/or so as to perform at least one of a data write and/or read operation received from a host device communicatively coupled to the SSD 200 (e.g., host 300 as illustrated in FIG. 1).

The SSD 200 can operate in response to an access request of a host 300. That is, the SSD controller 100 can access the storage medium 220 in response to an access request of the host 300. For example, the SSD controller 100 can control a read operation, a write operation, and/or an erase operation of the storage medium 220. Data to be stored in the storage medium 220 can be temporally stored in the buffer memory device 210. Data read from the storage medium 220 can be temporally stored in the buffer memory device 210. Data stored in the buffer memory device 210 can be transmitted to the storage medium 220 and/or to the host 300 according to a control of the SSD controller 100.

The SSD controller 100 can be connected to the storage medium 220 through a plurality of channels CH0~CHn. A plurality of nonvolatile memory devices NVM0~NVMi can be connected to each of the channels CH0~CHn. The plurality of nonvolatile memory devices can share one or more of the plurality of channels CH0~CHn. The storage medium 220 can be a NAND flash memory device. However, the storage medium 220 may not be limited to a NAND flash memory device. For example, the storage medium 220 may be one or more nonvolatile memory devices such as a NOR flash memory device, a phase change RAM (PRAM), a magnetic RAM (MRAM) or the like.

Each NAND flash memory device included in the storage medium 220 can store single bit data per a memory cell or multi bit data per a memory cell. A memory cell storing single bit data can be called a single level cell (SLC) and a memory cell storing multi bit data of two or more bits can be called a multi level cell (MLC). The single level cell can have one erase state and one program state according to a threshold voltage. The multi level cell can have one erase state and a plurality of program states according to a threshold voltage.

The SSD controller 100 can include an error correction code (hereinafter referred to as 'parity') managing module. The parity managing module can manage a block address of the storage medium 220, including recoverable error data. The parity managing module generates and/or removes parity data of a block including error data. If data of the block managed through the parity managing module may not be recovered by an error correction code unit, the parity managing module can recover error data with reference to the generated parity data.

Figure 2:
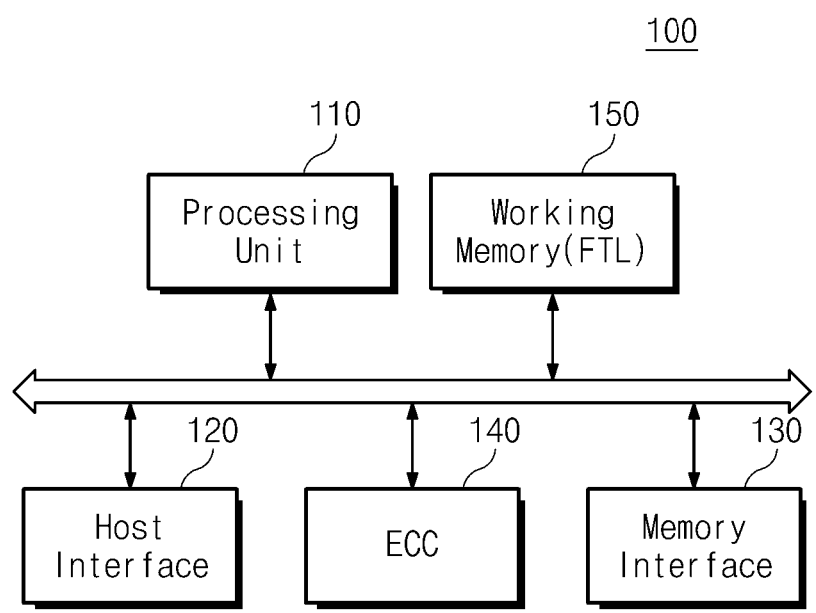
FIG. 2 is a block diagram illustrating a controller of the solid state drive in accordance with exemplary embodiments of the present general inventive concept.

FIG. 2 is a block diagram illustrating a controller of the solid state drive in accordance with exemplary embodiments of the present general inventive concept.

Referring to FIG. 2, a solid state drive (hereinafter referred to as SSD) controller 100 can include a processing unit 110, a host interface 120, a memory interface 130, an error correction code (ECC) unit 140, and a working memory 150. The constituent elements of the SSD controller 100 are not limited to the constituent elements described above. For example, the SSD controller may include a ROM (Read Only Memory) to store code data to be executed in an initial booting operation, a buffer memory controller to control a buffer memory device, a SDRAM, or the like.

The processing unit 110 can include a central processing unit, a micro processor, a programmable logic device, a field programmable gate array, and/or any other processor to carry out the exemplary embodiments disclosed herein. The processing unit 110 can control the operations of the SSD controller 100. The processing unit 110 can be configured to drive a firmware to control the SSD controller 100. The firmware can be loaded in the memory 150 to be driven.

The host interface 120 can provide an interface between the host (e.g., host 300 illustrated in FIG. 1) and the SSD controller 100. The host 300 and the SSD controller 100 can be connected to each other through an interface (e.g., one of various standard interfaces described below, or any other suitable interface to carry out the exemplary embodiments of the present general inventive concept). In another example, the host 300 and the SSD controller 100 can be connected to each other through a plurality of various standard interfaces. In these examples, the standard interfaces can include an advanced technology attachment (ATA), a serial ATA (SATA), an external SATA (e-SATA), a small computer small interface (SCSI), a serial attached SCSI (SAS), a peripheral component interconnection (PCI), a PCI-express (PCI-E), a universal serial bus (USB), IEEE 1394, a card interface or the like.

The memory interface 130 can provide an interface between the SSD controller 100 and the storage medium (e.g., storage medium 220 of FIG. 1). For example, data processed by the processing unit 110 can be stored in the storage medium 220. In another example, data stored in the storage medium 220 can be provided to the processing unit 110 through the memory interface 130. The memory interface 130 can include a memory controller to control the storage medium 220. The memory interface 130 can provide an interface between the SSD controller 100 and the buffer memory device (e.g., buffer memory device 210 of FIG. 1).

The error correction code unit 140 can recover damaged data. For example, the error correction code unit 140 may be configured to detect and recover an error of data read from the storage medium 220. In FIG. 1, the error correction code unit 140 can be provided as a constituent element of the SSD controller 100, but it may be provided as a constituent element of the storage medium 220.

A firmware and data to control the SSD controller 100 can be stored in the working memory 150. The stored firmware and data can be driven by the processing unit 110. The working memory 150 can include at least one of a cache, a DRAM, a SRAM, a FRAM, a PRAM, a ROM or a flash memory device. According to exemplary embodiments of the present inventive concept, a flash translation layer (FTL) can be stored in the working memory 150. When there is an access request from the host 300, the flash translation layer (FTL) stored in the working memory 150 can be driven by the processing unit 110.

According to exemplary embodiments of the present inventive concept, the flash translation layer 150 can include the error correction code (hereinafter referred to as 'parity') managing module. The parity managing module 150 can manage a block address of the storage medium including recoverable error data. The parity managing module 150 can generate parity data of a block, including error data. The parity managing module 150 can manage the generated parity data. For example, the parity managing module 150 can store the generated parity data in the assigned area of the storage medium 220. If data of the block managed by the parity managing module 150 may not be recovered by the error correction code unit 140, the parity managing module 150 can recover error data with reference to the parity data which was generated. An operation of the parity managing module is described in detail below in connection with FIG. 5.

Figure 3:
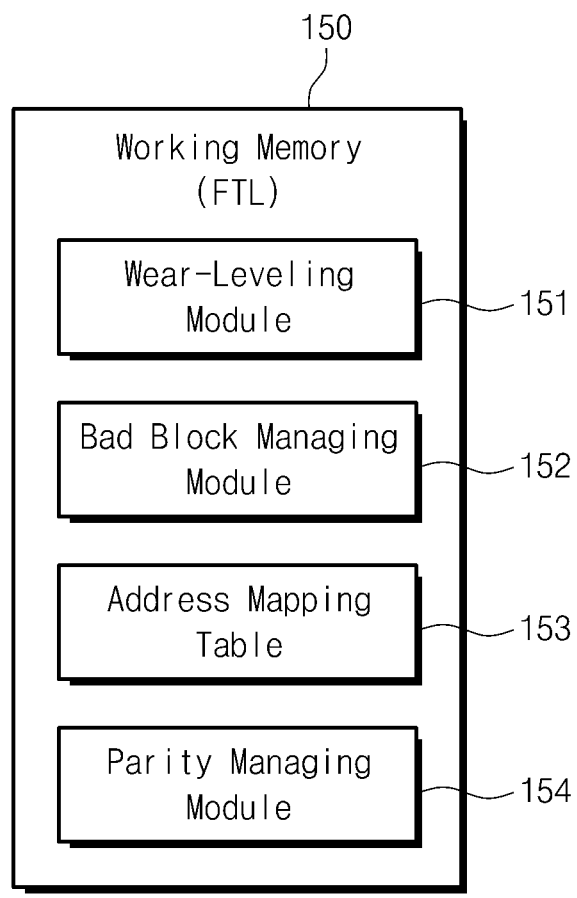
FIG. 3 is a block diagram illustrating a flash translation layer in accordance with exemplary embodiments of the present general inventive concept.

FIG. 3 is a block diagram illustrating a flash translation layer in accordance with exemplary embodiments of the present inventive concept.

A flash memory device constituting the storage medium (e.g., storage medium 220 of FIG. 1) can perform a read or a write operation by a page unit and an erase operation by a block unit. Here, the page can include a plurality of memory cells and the block can include a plurality of pages. Also, the flash memory device can perform an erase operation first so as to store new data in a memory cell in which data is stored. The flash memory device can manage a wear block generated by a continual use and a bad block having a physical defect.

A read, a write and an erase of the flash memory device can be managed. The flash translation layer can be system software (or firmware) to manage a read, a write, and/or an erase of the flash memory device. The flash translation layer can manage the flash memory device such that it operates in response to an access (for example, a read operation or a write operation) requested from a file system of the host. The flash translation layer can manage the SSD (e.g., SSD 200 of FIG. 1) so that it is considered a hard disk drive (HDD) to the file system of the host. The flash translation layer can be loaded to the working memory 150 to be driven by the processing unit (e.g., processing unit 110 of FIG. 2).

Referring to FIG. 3, the flash translation layer can include a plurality of modules such as a wear-leveling module 151, a bad block managing module 152, an address mapping table 153 and a parity managing module 154. However, the flash translation layer may not be limited to the modules described above. For example, the flash translation layer may include a garbage collection module to arrange blocks in which broken data are stored.

The wear-leveling module 151 can manage a wear-level with respect to the flash memory device. Memory cells in the flash memory device can age due to write and erase operations. Aged memory cells, that is, memory cells which are worn, can contribute to and/or cause a defect (for example, a physical defect). To minimize and/or prevent a specific block from having an increased rate of wear compared to the other blocks (e.g., being more rapidly worn), the wear-leveling module 151 can manage an erase-write cycle of each of the blocks.

The bad block managing module 152 can manage a block in which a defect occurs among the blocks of the flash memory device. As described before, a defect (for example, a physical defect) may occur in a memory cell which is worn. Data stored in the worn memory cell may not be normally written. Also, data may not be normally stored in the worn memory cell. The bad block managing module 152 can manage a use of a block including the memory cell in which a defect occurs is cut off.

When the file system accesses the SSD 200, the file system can provide a logical address to the SSD 200. The SSD controller 100 can map the logical address provided to a physical address of the flash memory device. That is, the flash translation layer can manage address mapping data for an address mapping and can manage the address translation data of the address mapping table 153.

If data of the block managed by the parity managing module 154 may not be recovered by the error correction code unit 140, the parity managing module 154 can recover error data with reference to the parity data which was generated. The parity managing module 154 can include sub modules. That is, the parity managing module 154 can include a parity group managing module, a parity generating module, and an error recovery module. A parity managing module according to exemplary embodiments of the present general inventive concept is described in detail below in connection with FIG. 4.

Figure 4:
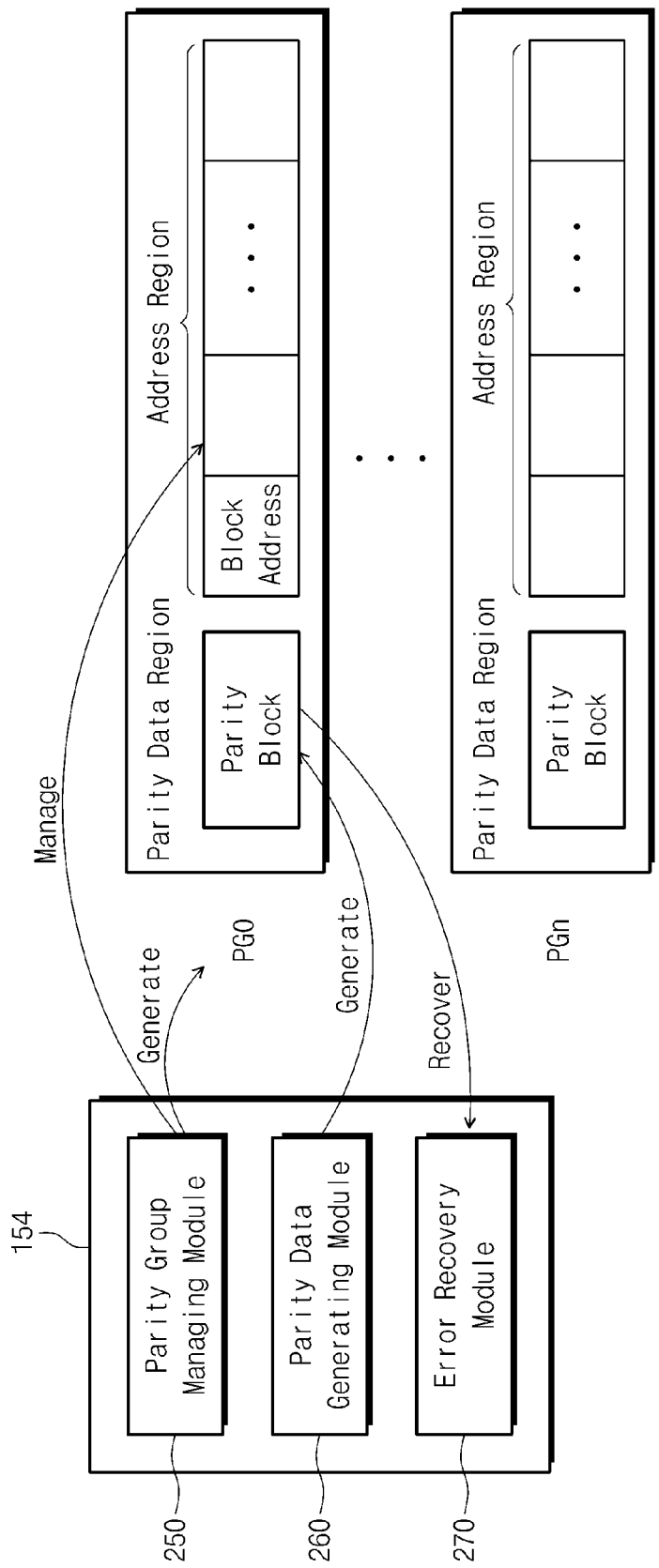
FIG. 4 is a block diagram illustrating sub-modules of a parity managing module in accordance with exemplary embodiments of the present general inventive concept.

FIG. 4 is a block diagram illustrating sub-modules of a parity managing module in accordance with exemplary embodiments of the present inventive concept.

Referring to FIG. 4, the parity can include sub modules such as a parity group managing module 250, a parity data generating module 260, and an error recovery module 270.

Error data in the flash memory device can be recovered by the error correction code unit 140 of the SSD controller 100. The error correction code unit 140 may not recover error data when the error correction code unit 140 outputs error data (e.g., uncorrectable error data) instead of recovering the error data. Error data which can be recovered by the error correction code unit 140 can be defined as correctable error data (hereinafter referred to as CorErr). Error data which may not be recovered by the error correction code unit 140 can be defined as uncorrectable error data (hereinafter referred to as UnCorErr).

The parity group managing module 250 can manage a parity group. That is, the parity group managing module 250 can generate and remove the parity group. Here, the parity group can include an area storing addresses of a plurality of blocks. In another example, the parity group can include an area storing data of a plurality of blocks. The parity group can include an area storing parity data. The parity group can be stored in a portion of the flash memory device.

The parity group managing module 250 can determine a size of the parity group. For example, the parity group managing module 250 can set up the number of blocks which can be included in the parity group. When the number of blocks to be inserted to a generated parity group is larger than the number of blocks which are set up, the parity group managing module 250 can generate new parity groups (PG0~PGn).

The parity group managing module 250 can manage an address of a block in which CorErr occurs as the parity group. The parity group managing module 250 can insert the address of a block in which CorErr occurs into the parity group. When error data does not occur any more in the block in which CorErr occurs, the parity group managing module 250 can remove an address of the corresponding block in the parity group.

The parity data generating module 260 can generate parity data. The generated parity data can be stored in a parity block through the parity group managing module 250. Here, the parity block can be an area in which data is stored. The parity group managing module 250 can manage one parity block per parity group. The parity group managing module 250 can also manage a plurality of parity blocks per parity group. The parity block can be managed by the same size as the size of the block in which real data is stored.

The parity data generating module 260 can generate parity data through a bitwise exclusive OR operation. For example, the parity data generating module 260 can perform an XOR operation on the same page offset (for example, a page address) of blocks. That is, the parity data generating module 260 can perform an XOR operation on data of all the blocks included in each parity group by a page unit. Parity data can be generated from the XOR operation.

The error recovery module 270 can recover error data with reference to parity data stored in the parity block. The error data recovery can be performed in the case that UnCorErr occurs when data of a block included in the parity group is read out. The error recovery module 270 can perform an XOR operation on data of all the blocks of the parity group and parity data of the parity block except, for example, the block in which UnCorErr occurs by a page unit. A result of a final XOR operation can become an original data of the block in which UnCorErr occurs. According to exemplary embodiments of the present general inventive concept, error data which may not be recovered by the error correction code unit 140 can be recovered by the parity managing module.

Figure 5:
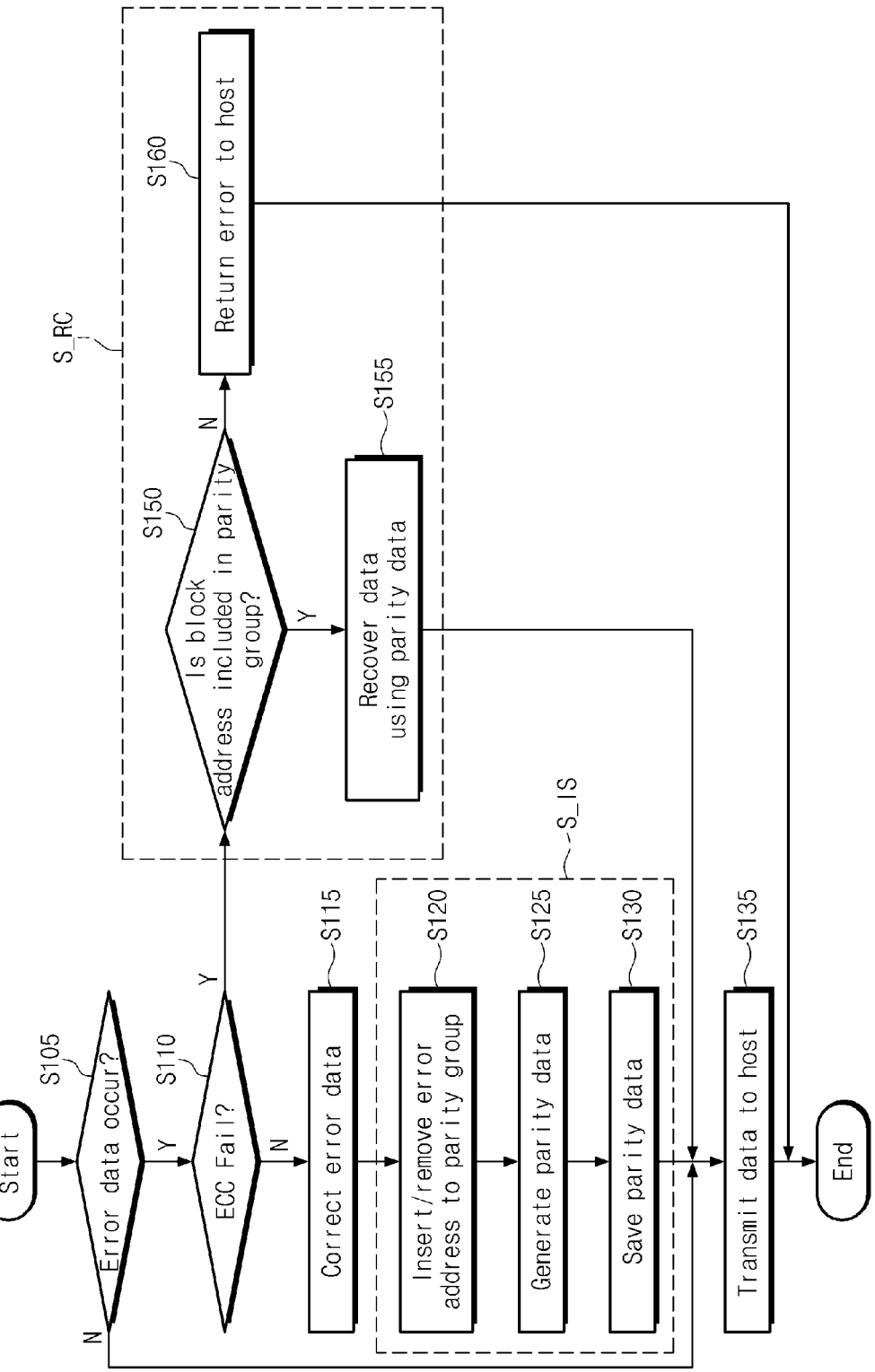
FIG. 5 is a flow chart illustrating an operation of the parity managing module in accordance with exemplary embodiments of the present general inventive concept.

FIG. 5 is a flow chart illustrating an operation of the parity managing module in accordance with exemplary embodiments of the present general inventive concept.

Referring to FIG. 5, the error correction code unit 140 of the SSD controller 100 can determine whether error data occurs or not when transmitting data to a host at operation S105. If error data does not occur, the SSD controller 100 can transmit the requested data to the host at operation S135.

If error data occurs when transmitting data to a host, the error correction code unit 140 can determine whether the error data which occurred can be recovered or not at operation S110. If the error data is CorErr, an address at which the CorErr occurs can be inserted into the parity group and an operation of generating parity data can be performed (operation S_IS). If the error data is the UnCorErr, a operation (operation S_RC) of notifying the host that error data is recovered or that a data transmitting error is generated.

If error data is CorErr, the error correction code unit 140 can correct the error data at operation S115. An address at which the CorErr occurs through the parity group managing module 250 can be inserted into the parity group at operation S120. The address at which the CorErr occurs can be a block address of the flash memory device. Since a new block can be inserted into the parity group, new parity data can be generated through the parity data generating module 260 at operation S125.

In operation S125, an XOR operation can be performed on data of the inserted block and data of the parity block to generate new parity data. The new parity data can be stored in the parity block through the parity group managing module 250 at operation S130. If a step of inserting the block in which CorErr occurs into the parity group is finished, data of which an error is corrected can be transmitted to the host at operation S135.

If error data is UnCorErr, it can be determined whether or not an address at which the UnCorErr occurs is included in the parity group at operation S150. The address at which the UnCorErr occurs can be a block address of the flash memory device. In the case that the block in which the UnCorErr occurs is included in the parity group, data of the block in which the UnCorErr occurs can be recovered through the error recovery module 270 at operation S155.

In the operation S155, parity data stored in the parity block of the corresponding parity group can be referenced. For example, an XOR operation can be performed on the parity data stored in the parity block and data of all the blocks included in the parity group. At this time, the XOR operation may not be performed on data of the block in which the UnCorErr occurs. A result of the XOR operation can become original data of the block in which the UnCorErr occurs.

In the case that the block in which the UnCorErr occurs is not included in the parity group, error data may not be corrected through the error correction code unit 140 and an error recovery may not be possible. Thus, the SSD controller 100 can inform the host of occurrence of a transmission error at operation S160.

Figure 6:
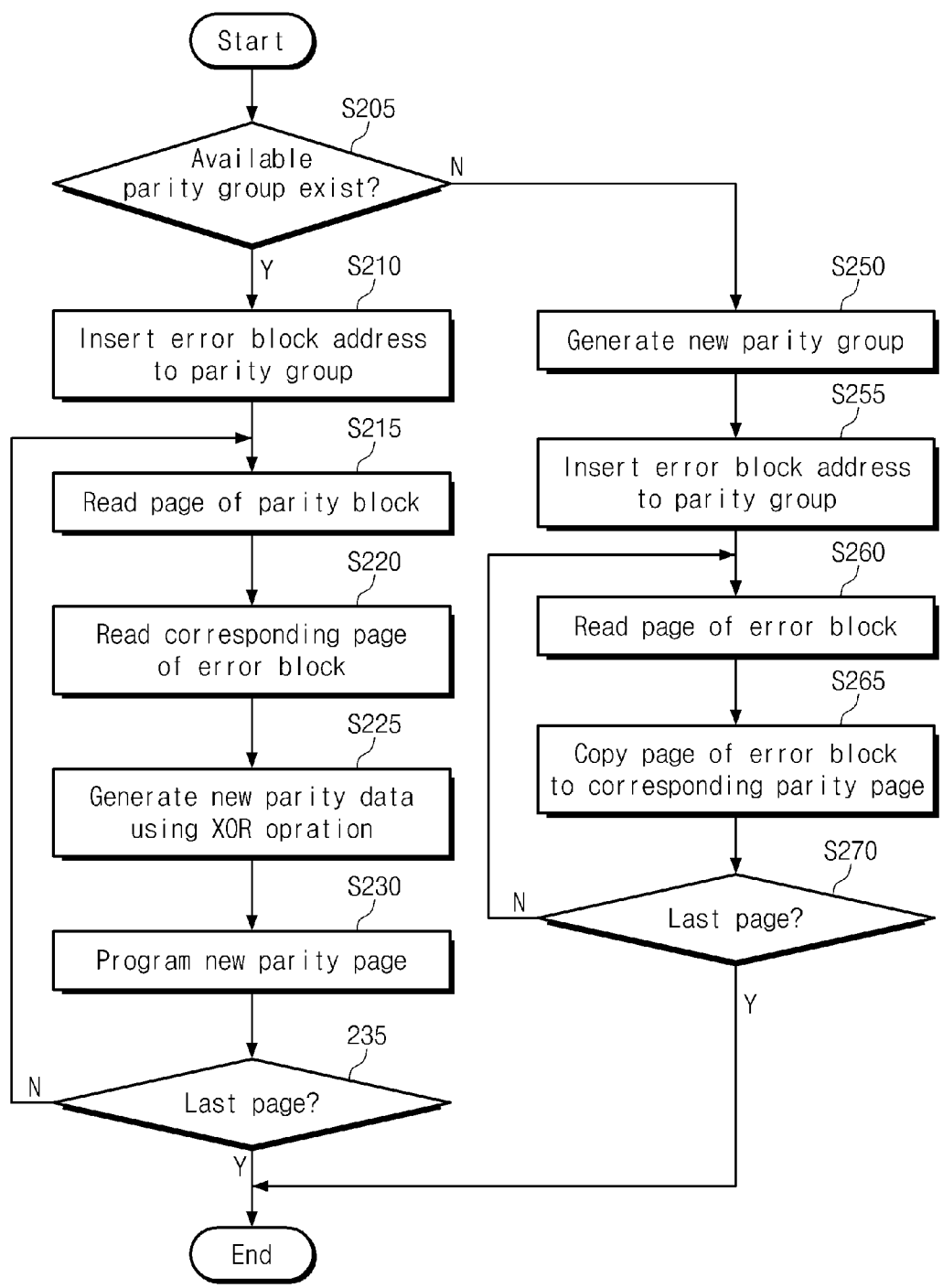
FIG. 6 is a flow chart illustrating a generating operation of parity data in accordance with exemplary embodiments of the present general inventive concept.

FIG. 6 is a flow chart illustrating a generating operation of parity data in accordance with exemplary embodiments of the present inventive concept.

Referring to FIG. 6, as illustrated in FIG. 5, in the case that error data is CorErr, an operation of inserting an address at which the CorErr occurs into the parity group and generating parity data is illustrated in detail.

The parity group managing module 250 can determine whether or not a parity group into which the block (hereinafter referred to as 'error block') in which the CorErr occurs is inserted exists at operation S205. If the parity group into which the error block is inserted exists, an error block address can be inserted into the parity group assigned through the parity group managing module 250 at operation S210.

A first page of a parity block included in the corresponding parity group can be read, and the read data can be stored in the working memory 150 at operation S215. A page of an error block corresponding to the first page of the parity block, that is, a first page of the error block can be read, and the read data can be stored in the working memory 150 at operation S220.

An XOR operation can be performed on data of the first page of the parity block and data of the first page of the error block through the parity data generating module 260, and new parity data can be generated at operation S225. The generated new parity data can be stored in the corresponding page of the parity block at operation S230. Parity data generating operations (e.g., operations S215~S230) can be repeatedly performed so that parity data is generated with respect to all the pages in which data of the error block can be stored at operation S235.

When a parity group into which the error block is to be inserted does not exist, a new parity group can be generated through the parity group managing module 250 at operation S250. An address of the error block can be inserted into the newly generated parity group at operation S255. A first page of the error block can be read and the read data can be stored in the working memory 150 at operation S260.

Because of the newly generated parity group, parity data may not be stored in the parity block. Thus, the data of the first page of the error block stored in the working memory 150 may be copied into a corresponding page of the parity block at operation S265. Parity data generating operations (e.g., operations S260~S265) can be repeatedly performed so that parity data can be generated with respect to all the pages in which data of the error block is stored at operation S270.

Figure 7:
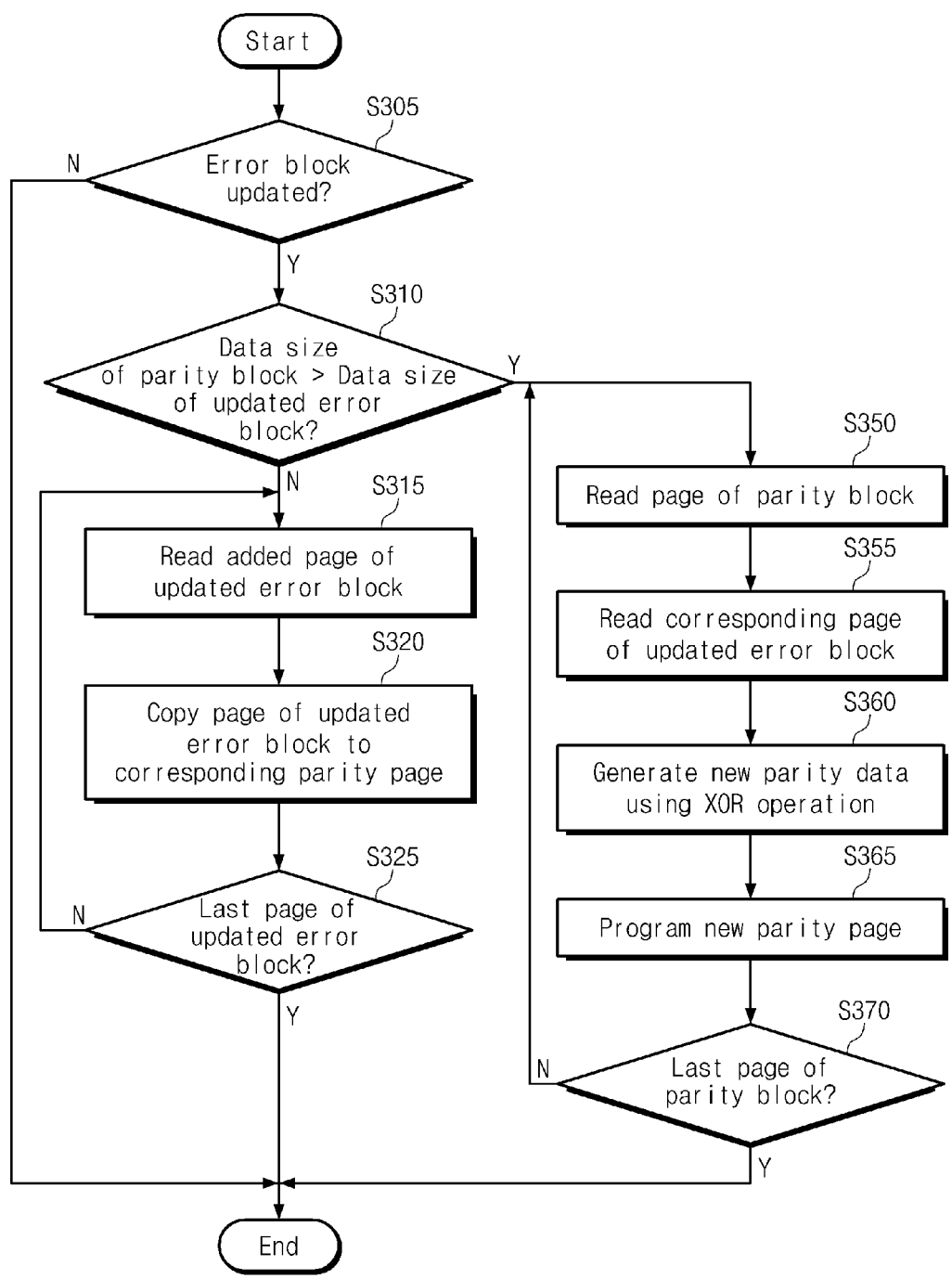
FIG. 7 is a flow chart illustrating a generating operation of parity data in accordance with a exemplary embodiments of the present general inventive concept.

FIG. 7 is a flow chart illustrating a generating operation of parity data in accordance with exemplary embodiments of the present inventive concept.

Referring to FIG. 7, an operation of generation of parity data is illustrated when data of the error block included in the parity group is updated.

When data of the error block included in the parity group is updated at operation S305, a size of the updated data of the error block and a size of data of the parity block can be compared with each other with the parity group managing module 250 at operation S310. When data is inserted into the error block, the size of the updated data of the error block may be greater than the size of data of the parity block.

When the size of the updated data of the error block may be greater than the size of data of the parity block, the inserted page of the updated error block can be read, and the read data can be stored in the working memory 150 at operation S315. The parity data may not be stored in a page of the parity block corresponding to the inserted page of the updated error block. Thus, the inserted page of the updated error block stored in the working memory 150 can be copied into the corresponding page of the parity block at operation S320. Parity data generating operations (e.g., operations S315~S320) can be repeatedly performed so that parity data is generated with respect to all the inserted pages of the updated error block at operation S325.

The updated data of the error block may be changed when the size of the updated data of the error block is smaller than the size of data of the parity block. When the first page of the parity block included in the corresponding parity group can be read and the read data can be stored in the working memory 150 at operation S350. A page of the updated error block corresponding to the first page of the parity block, that is, a first page of the updated error block can be read and the read data can be stored in the working memory 150 at operation S355.

An XOR operation can be performed on data of the first page of the parity block and data of the first page of the updated error block through the parity data generating module 260 and new parity data is generated at operation S360). The generated new parity data can be stored in the corresponding page of the parity block at operation S365. Parity data generating operations (e.g., operations S350~S365) can be repeatedly performed so that parity data is generated with respect to all the pages in which data of the updated error block is stored at operation S370.

Figure 8:
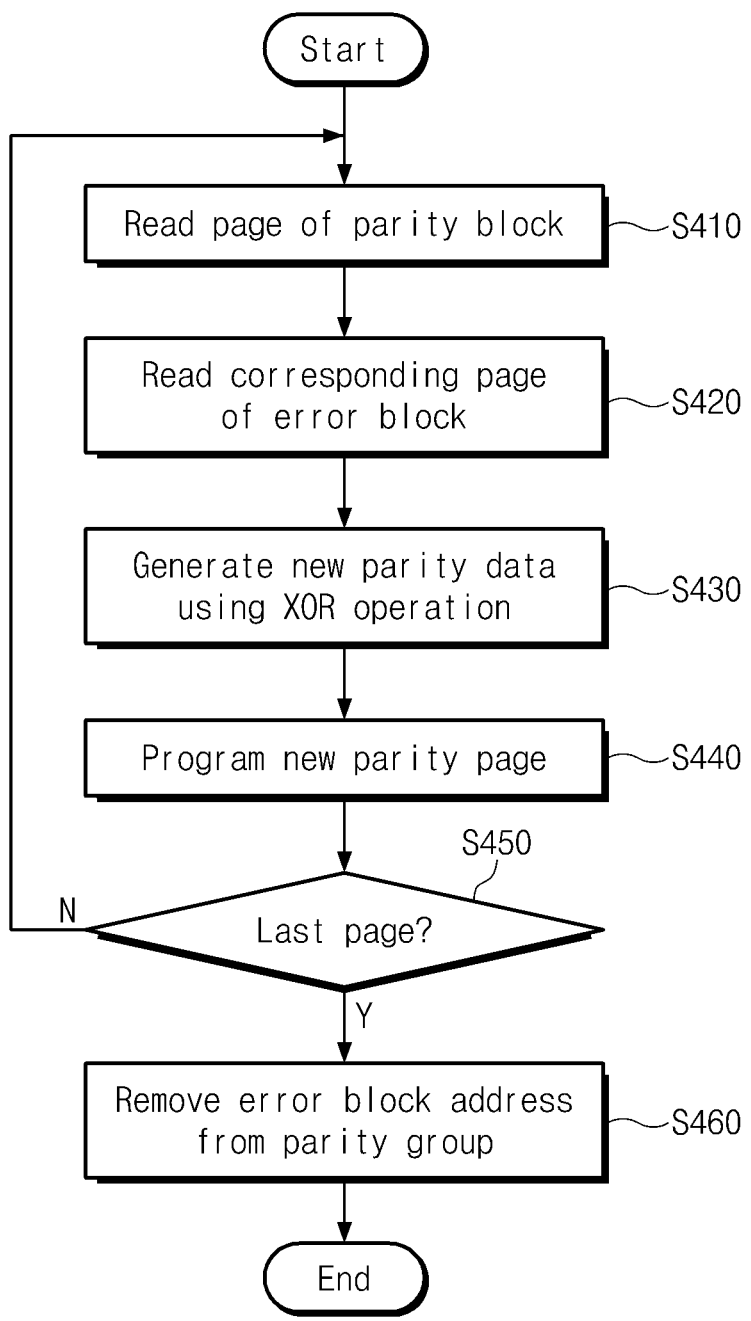
FIG. 8 is a flow chart illustrating a generating operation of parity data in accordance with exemplary embodiments of the present general inventive concept.

FIG. 8 is a flow chart illustrating a generating operation of parity data in accordance with exemplary embodiments of the present inventive concept.

Referring to FIG. 8, in the case that an error block included in a parity group is removed from the parity group, a generation operation of parity data is illustrated. When the error block is removed from the parity group may be when it is determined that error data does not occur any more in the error block. Whether error data does not occur any more in the error block can be determined based on whether error data does not occur during the predetermined number of block accesses. For example, when error data does not occur when the error block is accessed ten times after the error block is inserted into the parity group, it can be determined that an error data may not occur any more in the error block.

When it is determined that error data does not occur any more in the error block included in the parity group through the parity group managing module 250, a first page of the parity block included in the corresponding parity group can be read and the read data can be stored in the working memory 150 at operation S410. A page of an error block (hereinafter referred to as 'removed error block') in which error data does not occur any more corresponding to the first page of the parity block, that is, the first page of the removed error block can be read, and the read data can be stored in the working memory 150 at operation S420.

An XOR operation can be performed on data of the first page of the parity block, and data of the first page of the removed error block through the parity data generating module 260 and new parity data can be generated at operation S430). The new generated parity data can be stored in the corresponding page of the parity block at operation S440. Parity data generating operations (e.g., operation S410~S440) can be repeatedly performed so that parity data can be generated with respect to all the pages in which data of the removed error block is stored at operation S450. When new parity data is generated, an address of the removed error block can be removed from the corresponding parity group through the parity group managing module 250 at operation S460.

Figure 9:
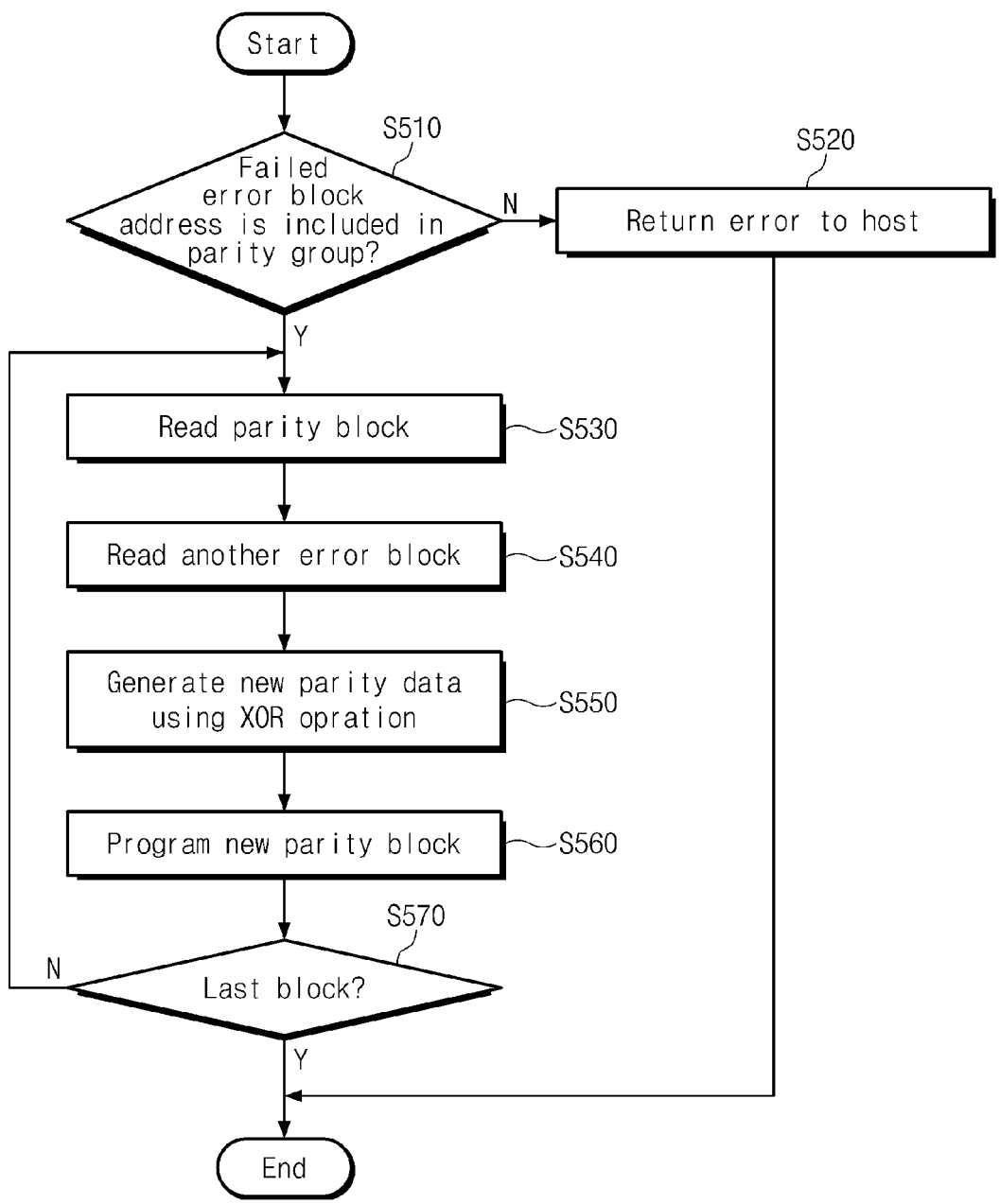
FIG. 9 is a flow chart illustrating an error recovery operation in accordance with exemplary embodiments of the present general inventive concept.

FIG. 9 is a flow chart illustrating an error recovery operation in accordance with exemplary embodiments of the present general inventive concept.

FIG. 9 illustrates an operation (e.g., operation S_RC) of informing the host of a recovery of the error data or occurrence of data transmission error when error data is UnCorErr.

When error data is the UnCorErr that may not be recovered by the error correction code unit 140, it is determined whether an address at which the UnCorErr occurs is included in the parity group through the parity group managing module 250 at operation S510. The address at which the UnCorErr occurs may be a block address of the flash memory device. If a block (hereinafter referred to as 'fail error block') in which the UnCorErr occurs is not included in the parity group, the error data may not be corrected through the error correction code unit 140 and may not be recovered because of not being included in the parity group. Thus, the SSD controller 100 can inform the host of occurrence of a transmission error at operation S520.

When the fail error block is included in the parity group, a parity block included in the parity group can be read and the read data can be stored in the working memory 150 at operation S530. The other error blocks included in the parity group can be read, and the read data can be stored in the working memory 150 at operation S540. An XOR operation can be performed on the data of the parity block and the data of the other error blocks through the parity data generating module 157, and new parity data can be generated at operation S550. The new generated parity data can be stored in the parity block at operation S560.

Parity data generating operations (e.g., operations S530~S560) can be repeatedly performed so that parity data can be generated with respect to all the error blocks included in the parity group except the fail error block at operation S570. While parity data generating operations (e.g., operations S530~S560) can be repeatedly performed, the operation S560 may be omitted in exemplary embodiments of the present general inventive concept. For example, when the number of error blocks included in the parity group is two or more, parity data generated with respect to a first error block can be temporally stored in the working memory 150. That is, an operation that the parity block is read as the working memory 150 may be omitted. Thus, an XOR operation may be performed on the temporally stored parity data and data of a second error block by a page unit.

According to the error recovery operation in accordance with exemplary embodiments of the present inventive concept, parity data can be generated with respect to all the error blocks included in the parity group. An XOR operation may not performed on the fail error block. Thus, a result of the XOR operation can become original data of the fail error block.

The SSD controller 100 can use an error correction code (ECC) to correct an error generated when decoding data. An operation of adding an error correction code to original data before storing data can be called an ECC encoding and a procedure of decoding original data by separating added ECC information from data read from a memory cell can be called an ECC decoding. The error correction code unit 140 can include one or more error correction codes (ECC). For example, the error correction code unit 140 can include an error correction code (ECC) such as BCH (Bose, Ray-Chauduri, Hocquenghem) code or a Read-Solomon code.

The method of controlling an error of the data storage device in accordance with exemplary embodiments of the present inventive concept may be applied to the SSD controller (e.g., the SSD controller 100 illustrated in FIGS. 1-2 and described above). However, the method may not be limited to the SSD controller. For example, the method may be applied to a RAID controller controlling a plurality of data storage devices (e.g., HDD or SSD).

Figure 10:
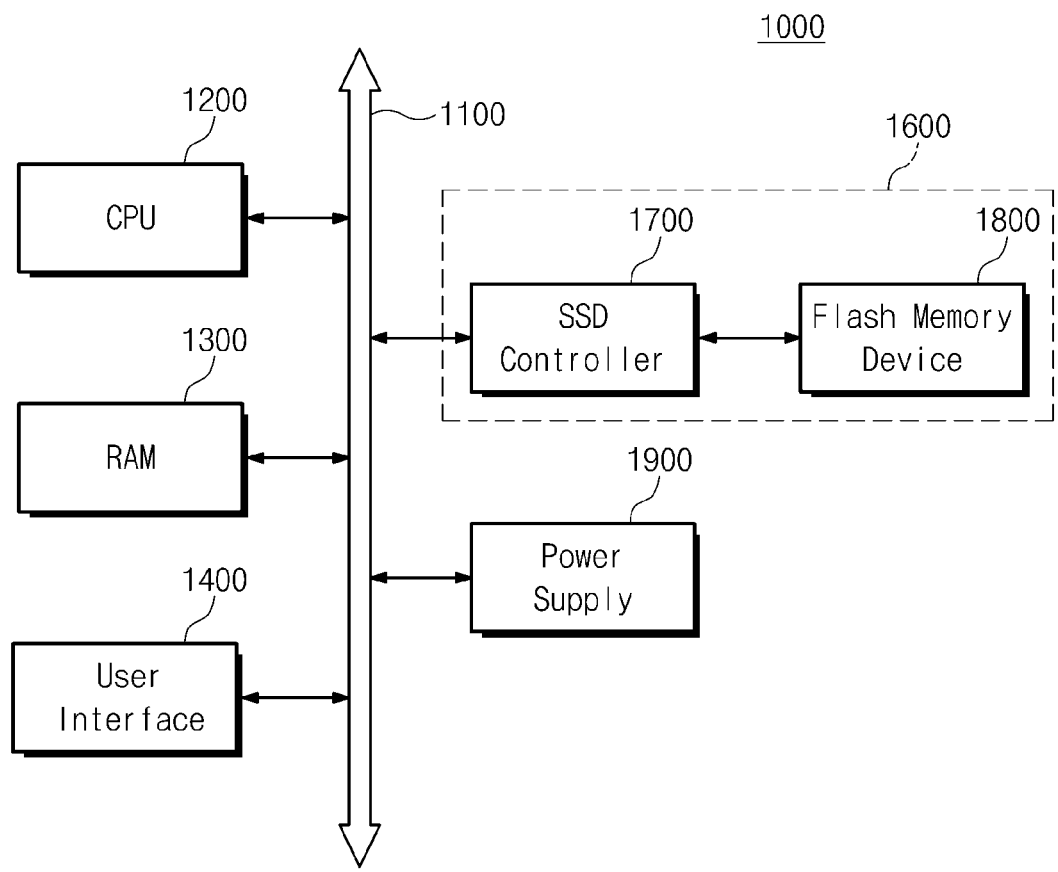
FIG. 10 is a block diagram illustrating a user device including a solid state drive in accordance with exemplary embodiments of the present general inventive concept.

FIG. 10 is a block diagram illustrating a user device including a solid state drive in accordance with exemplary embodiments of the present inventive concept.

Referring to FIG. 10, a user device 1000 can include a system bus 1100, a central processing unit 1200, a random access memory (RAM) 1300, a user interface 1400, a solid state drive 1600, and a power supply 1900.

The solid state drive 1600 can be electrically connected to the user device 1000 through the system bus 1100. The solid state drive 1600 can include a SSD controller 1700 and a nonvolatile memory device 1800. The solid state drive 1600 may include a plurality of nonvolatile memory devices. Data provided by the user interface 1400 or processed by the central processing unit 1200 may be stored in the nonvolatile memory device 1800 through the SSD controller 1700. Data stored in the nonvolatile memory device 1800 can be provided to the central processing unit 1200 or the user interface 1400 through the SSD controller 1700.

The RAM 1300 can be a memory of the central processing unit 1200. The power supply 1900 can provide power to the user device 1000. For example, the power supply 1900 can be a power supply device such as a battery. Although not illustrated in the drawing, the user device 1000 may include an application chipset, a camera image processor, or the like.

The method of controlling an error of the data storage device in accordance with exemplary embodiments of the present inventive concept may be applied to a user device including a nonvolatile memory device. For example, a user device may include a personal computer memory card international association (PCMCIA) card, a compact flash (CF) card, a smart media card, a memory stick, a multimedia card (MMC, RS-MMC, MMC-micro), a secure digital (SD) card (SD, Mini-SD, Micro-SD, SDHC), an universal flash storage and so on.

In another example, a user device may be applied to a computer, a portable computer, an ultra mobile personal computer, a work station, a net book, a personal digital assistant (PDA), a web tablet, a wireless phone, a mobile phone, a digital camera, a digital audio recorder, a digital audio player, a digital video recorder, a digital video player, a device that can transmit and receive data in a wireless environment, one of various electronic devices constituting a home network, one of various electronic devices of a computer network, one of various electronic devices of a telematics network, one of various constituent elements of a computer system, a radio frequency identification device (RFID) or an embedded system.

In another example, the storage medium 220 or the SSD controller 100 may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

In the exemplary embodiments of the present general inventive concept disclosed herein, reliability of the solid state drive is increased and/or improved to reduce a data transmission error.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although several embodiments of the present invention have been illustrated and described, it would be appreciated by those skilled in the art that changes may be made in these embodiments without departing from the principles and spirit of the general inventive concept, the scope of which is defined in the claims and their equivalents.

What is claimed is:

1. A method of controlling a solid state drive, comprising:
    detecting and correcting an error of data read from a nonvolatile memory device;
    registering an address in a parity group, the address being an area of the nonvolatile memory device in which the detected error data is stored;
    generating parity data from data of the area of the address registered in the parity group; and
    storing the address included in the parity group and the parity data in a parity area.

2. The method of claim 1, wherein the parity area corresponds to a block of the nonvolatile memory device.

3. The method of claim 2, wherein the address is a block address of the nonvolatile memory device.

4. The method of claim 1, wherein the generating the parity data comprises:
    when the number of the addresses registered in the parity group is two or more, performing an exclusive OR (XOR) operation on data of each of the registered areas.

5. The method of claim 4, wherein the exclusive OR (XOR) operation is performed by a page unit of the nonvolatile memory device.

6. The method of claim 1, wherein the registering the address comprises:
    when the number of the addresses to be registered in the parity group is larger than a reference value, generating a new parity group.

7. The method of claim 1, further comprising:
    when a new address is registered in the parity group, performing an exclusive OR (XOR) operation on the stored parity data and data of the newly registered address area.

8. The method of claim 1, further comprising:
    when the data of the address registered in the parity group is updated, newly generating the parity data.

9. The method of claim 1, further comprising:
    when an error is not detected any more in the data of the address registered in the parity group, removing the address at which the error is not detected from the parity group.

10. The method of claim 9, further comprising:
    when the address registered in the parity group is removed, generating the stored parity data and the address data to be removed as parity data updated according to an exclusive OR (XOR) operation.

11. The method of claim 1, further comprising:
    when the detected error data is not corrected, determining whether or not the address at which the error data is stored is included in the parity group.

12. The method of claim 11, further comprising:
    when the address at which the error data is stored is not included in the parity group, outputting a data transmission error.

13. The method of claim 11, further comprising:
    when the address at which the error data is stored is included in the parity group, performing an exclusive OR (XOR) operation on data of all the addresses included in the parity group except the address at which the uncorrectable error data is stored and on the stored parity data, and correcting the uncorrectable error data according to an operation result.

14. A solid state drive, comprising:
    a nonvolatile memory device; and
    a controller having an interface between the nonvolatile memory device and a host and including an error correction code unit to detect and correct an error,
    wherein when an error which is corrected by the error correction code unit is detected in data read from the nonvolatile memory device, the controller stores parity data of data of an area in which the read data is stored in the nonvolatile memory device, and
    wherein when an error which is not corrected by the error correction code unit is detected in data read from the nonvolatile memory device, the controller corrects the error which is not corrected by the error correction code unit with reference to the stored parity data.

15. The solid state drive of claim 14, wherein the controller registers an address of the nonvolatile memory device including the correctable error data in a parity group and wherein the controller generates the parity data from data of an address area registered in the parity group and then stores the parity data.

16. The solid state drive of claim 15, wherein the generated parity data is stored in an assigned area of the nonvolatile memory device.

17. The solid state drive of claim 15, further comprising:
a plurality of nonvolatile memory devices, wherein the plurality of nonvolatile memory devices is connected to the controller through a plurality of channels and the parity group is generated with respect to the plurality of nonvolatile memory devices connected to each of the plurality of channels.

18. The solid state drive of claim 14, wherein the parity data is generated by the controller with an exclusive OR (XOR) operation between data in which the error is detected.

19. The solid state drive of claim 14, wherein when a data in which the parity data is generated is not corrected by the error correction code unit, the data which is not corrected by the error correction code unit is recovered by the controller with reference to the stored parity data.

20. The solid state drive of claim 14, wherein when a data in which the parity data is not generated is not corrected by the error correction code unit, a data transmission error is outputted to the host by the controller.

* * * * *